(12) United States Patent
Ifuku et al.

(10) Patent No.: US 12,351,905 B2
(45) Date of Patent: Jul. 8, 2025

(54) FILM FORMING METHOD AND FILM FORMING APPARATUS

(71) Applicant: Tokyo Electron Limited, Tokyo (JP)

(72) Inventors: Ryota Ifuku, Nirasaki (JP); Makoto Wada, Nirasaki (JP); Nobutake Kabuki, Nirasaki (JP); Takashi Matsumoto, Nirasaki (JP); Hiroshi Terada, Nirasaki (JP); Genji Nakamura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 306 days.

(21) Appl. No.: 17/935,594

(22) Filed: Sep. 27, 2022

(65) Prior Publication Data
US 2023/0102051 A1   Mar. 30, 2023

(30) Foreign Application Priority Data

Sep. 29, 2021 (JP) ................................. 2021-159147
Feb. 3, 2022 (JP) ................................. 2022-015348

(51) Int. Cl.
| | | |
|---|---|---|
| C23C 2/06 | (2006.01) |
| C23C 16/02 | (2006.01) |
| C23C 16/26 | (2006.01) |
| C23C 16/44 | (2006.01) |
| C23C 16/513 | (2006.01) |

(52) U.S. Cl.
CPC .......... *C23C 16/26* (2013.01); *C23C 16/0209* (2013.01); *C23C 16/0227* (2013.01); *C23C 16/0272* (2013.01); *C23C 16/4408* (2013.01); *C23C 16/513* (2013.01)

(58) Field of Classification Search
None
See application file for complete search history.

(56) References Cited

U.S. PATENT DOCUMENTS

| | | | |
|---|---|---|---|
| 2019/0062947 A1* | 2/2019 | Savas ................ | H01J 37/32651 |
| 2020/0140279 A1* | 5/2020 | Shin ...................... | C01B 32/186 |

FOREIGN PATENT DOCUMENTS

| | | | |
|---|---|---|---|
| CN | 109502575 | * | 3/2019 |
| CN | 109852944 | * | 6/2019 |
| CN | 109852944 A | * | 6/2019 |
| JP | 2019-055887 A | | 4/2019 |
| KR | 10-2009-0122259 A | | 11/2009 |
| KR | 10-2020-0135506 A | | 12/2020 |

OTHER PUBLICATIONS

Munoz et al "Direct synthesis of graphene on silicon oxide by low temperature plasma enhanced chemical vapor deposition" Nanoscale 2018, 10, 12779-12787 (Year: 2018).*

(Continued)

*Primary Examiner* — Mandy C Louie
(74) *Attorney, Agent, or Firm* — Armstrong Teasdale LLP

(57) ABSTRACT

A film forming method includes: a loading process of loading a substrate into a processing container; a first process of forming an interface layer having an amorphous structure or a microcrystalline structure on the substrate by plasma of a first mixed gas including a carbon-containing gas; and a second process of forming a graphene film on the interface layer by plasma of a second mixed gas including the carbon-containing gas.

19 Claims, 11 Drawing Sheets

(56) References Cited

OTHER PUBLICATIONS

Chen "Oxygen-Aided Syntehsis of Polycrystalline Graphene on Silicon Dioxides Substrates" JACS 2011, 133, 17548-17551 (Year: 2011).*

Chen et al. "Two-stage metal-catalyst free growth of high-quality polycrystalline graphene films on silicon nitride substrates" Advanced Materials 2013, 25, 992-997 (Year: 2013) <https://advanced.onlinelibrary.wiley.com/doi/epdf/10.1002/adma.201202973>.*

* cited by examiner

FILM FORMING METHOD AND FILM FORMING APPARATUS

CROSS-REFERENCE TO RELATED APPLICATIONS

This application is based upon and claims the benefit of priority from Japanese Patent Application No. 2021-159147, filed on Sep. 29, 2021, and No. 2022-015348, filed on Feb. 3, 2022, the entire contents of which are incorporated herein by reference.

TECHNICAL FIELD

The present disclosure relates to a film forming method and a film forming apparatus.

BACKGROUND

In recent years, graphene films have attracted attention as new thin-film barrier layer materials to replace metal nitride films, and various techniques have been proposed as graphene film forming techniques. For example, it has been proposed to form a graphene film directly on a silicon substrate, an insulating film, or the like by forming the graphene film at a high radical density and a low electron temperature with a microwave plasma chemical vapor deposition (CVD) apparatus (e.g., Patent Document 1).

PRIOR ART DOCUMENT

Patent Document

Patent Document 1: Japanese Laid-Open Patent Publication No. 2019-055887

SUMMARY

A film forming method according to an aspect of the present disclosure includes: a loading process of loading a substrate into a processing container; a first process of forming an interface layer having an amorphous structure or a microcrystalline structure on the substrate by plasma of a first mixed gas including a carbon-containing gas; and a second process of forming a graphene film on the interface layer by plasma of a second mixed gas including the carbon-containing gas.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Hereinafter, various embodiments will be described in detail with reference to the drawings. The technology disclosed herein is not limited by the following embodiments. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

When a graphene film is directly formed on a silicon substrate or an insulating film, grain boundaries occur in the formed graphene film. The occurrence of the grain boundaries in the graphene film may degrade the barrier property at an interface between the silicon substrate and the graphene film. That is, the crystal grain boundaries of the graphene film serve as diffusion paths, so that elements diffuse from the silicon substrate, or elements diffuse from a metal-containing film or the like formed on the graphene film toward the silicon substrate.

Therefore, it is desired to improve the barrier property at the interface between the substrate and the graphene film.
[Example of Flow of Film Forming Method according to Embodiment]

Figure 1:
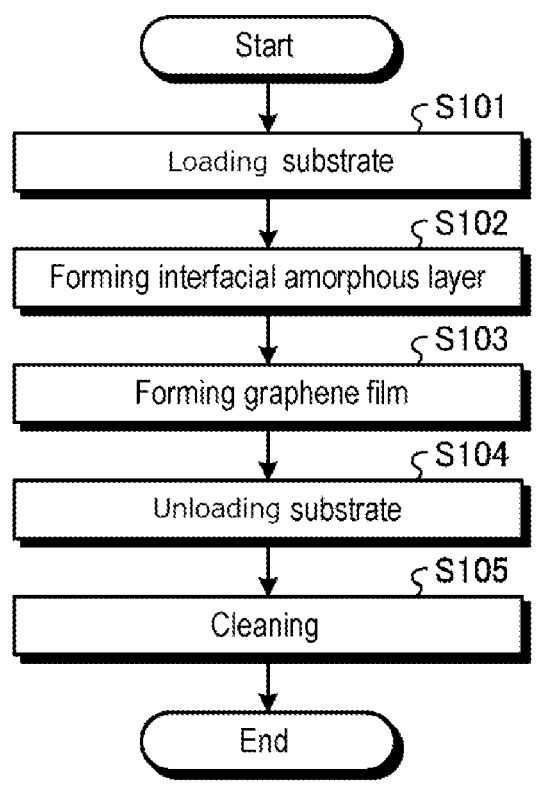
FIG. 1 is a flow chart illustrating an example of a flow of a film forming method according to an embodiment.

FIG. 1 is a flow chart illustrating an example of a flow of a film forming method according to an embodiment.

First, a substrate is loaded into a processing container and placed on a stage disposed inside a processing container (step S101, in a loading process).

Subsequently, an interface layer having an amorphous structure or a microcrystalline structure (hereinafter, sometimes referred to as an interfacial amorphous layer) is formed on the substrate by plasma of a first mixed gas including a carbon-containing gas (step S102, in an interfacial amorphous layer forming process). As the carbon-containing gas, for example, acetylene ($C_2H_2$), ethylene ($C_2H_4$), methane ($CH_4$), ethane ($C_2H_6$), propane ($C_3H_8$), propylene ($C_3H_6$), methanol ($CH_3OH$), ethanol ($C_2H_5OH$), or the like may be used. The first mixed gas includes a hydrogen-containing gas and an inert gas in addition to the carbon-containing gas. As the hydrogen-containing gas, for example, a $H_2$ gas, a $NH_3$ gas, or the like may be used. As the inert gas, for example, an Ar gas, a $N_2$ gas, a He gas, or the like may be used. In addition, the plasma of the first mixed gas is generated by using, for example, microwaves. In the interfacial amorphous layer forming process, a flow rate of the hydrogen-containing gas in the first mixed gas may be controlled to vary with the lapse of time. The interfacial amorphous layer forming process is an example of a first process.

Subsequently, a graphene film is formed on the interfacial amorphous layer by plasma of a second mixed gas including a carbon-containing gas (step S103, in a graphene film forming process). As the carbon-containing gas, the same gas as the carbon-containing gas included in the first mixed gas may be used. The second mixed gas includes a hydrogen-containing gas and an inert gas in addition to the carbon-containing gas. As the hydrogen-containing gas, the same gas as the hydrogen-containing gas included in the first mixed gas may be used. As the inert gas, the same gas as the inert gas included in the first mixed gas may be used. In addition, the plasma of the second mixed gas is generated by using, for example, microwaves. In addition, in the graphene film forming process, a flow rate of the hydrogen-containing gas in the second mixed gas is maintained at a constant value. In this case, the flow rate of the hydrogen-containing gas in the second mixed gas may be equal to or higher than the flow rate of the hydrogen-containing gas in the first mixed gas. The hydrogen-containing gas contributes as an etchant to the graphene film when forming the graphene film. For this reason, it is possible to remove unstable carbon bonds from the graphene film by increasing the flow rate of the hydrogen-containing gas in the second mixed gas so that the structure of the graphene film can be stabilized. The graphene film forming process is an example of a second process.

When the formation of the graphene film is completed, the substrate is unloaded from the processing container by using a transfer mechanism (not illustrated) (step S104).

After the substrate is unloaded from the processing container, the interior of the processing container is cleaned (step S105). For example, a dummy wafer is placed on the stage, and a cleaning gas is supplied into the processing container to remove a carbon film such as an amorphous carbon film adhering to an inner wall of the processing container. As the cleaning gas, an $O_2$ gas may be used, but oxygen-containing gases such as a CO gas and a $CO_2$ gas may also be used. In addition, the cleaning gas may include a noble gas such as an Ar gas. The dummy wafer may not be provided. In addition, the cleaning may be performed for each film forming process, or may be performed when a predetermined number of film forming processes is reached. Once the cleaning is completed, the process ends.

In this way, by forming the graphene film after forming the interface layer having the amorphous structure or the microcrystalline structure on the substrate, it is possible to block the crystal grain boundaries of the graphene film with an interface layer, which has an amorphous structure having no crystal grain boundaries or a microcrystalline structure. As a result, it is possible to improve the barrier property at the interface between the substrate and the graphene film.

[State Transition up to Formation of Graphene Film]

Figure 2:
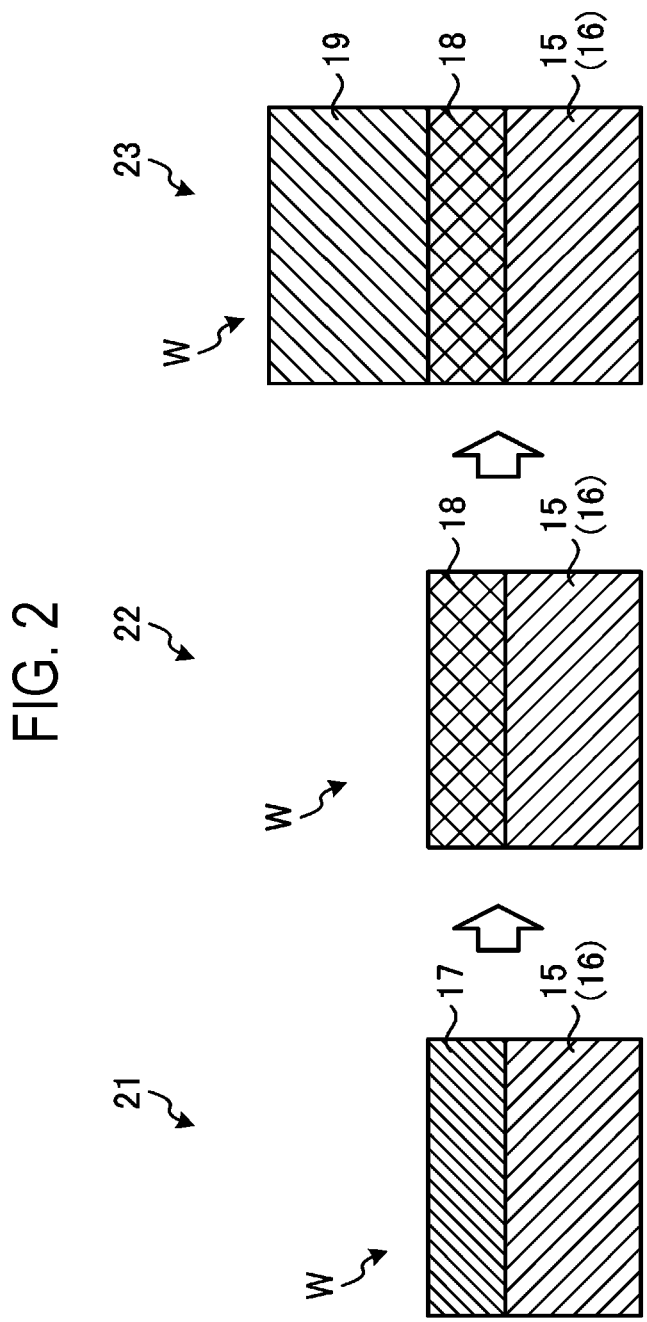
FIG. 2 is a view illustrating an example of a state transition of a substrate from formation of an interface layer having an amorphous structure or a microcrystalline structure to formation of a graphene film in an embodiment.

Next, a state transition of the substrate from the formation of the interface layer having the amorphous structure or the microcrystalline structure to the formation of the graphene film will be described with reference to FIG. 2. The interface layer is described as an interfacial amorphous layer having an amorphous structure, and may be written together with interfacial amorphous layer below. FIG. 2 is a view illustrating an example of the state transition of the substrate from the formation of the interfacial amorphous layer to the formation of the graphene film in an embodiment. In FIG. 2, there is schematically illustrated a state transition when the interfacial amorphous layer forming process and the graphene film forming process are performed on the substrate W on which a base film 15 is formed. State 21 is a state in which the substrate W is loaded into the processing container, and a natural oxide film (an example of an oxygen-containing layer) 17 is formed on the surface of the base film 15. The base film 15 is, for example, a polysilicon (polycrystalline silicon) film or a silicon film, and the natural oxide film 17 is, for example, a silicon oxide film ($SiO_2$). The natural oxide film 17 is formed since the surface of the base film 15 is oxidized by, for example, oxygen derived from oxygen, moisture, or the like in the interior of the transfer device, the processing container, or the like.

When the interfacial amorphous layer forming process is performed on the substrate W in State 21, the substrate W transitions to State 22. In the interfacial amorphous layer forming process, since active species of carbon contained in the plasma of the first mixed gas react with the natural oxide film 17 on the base film 15, an interfacial amorphous layer 18 is formed on the base film 15 made of silicon, as illustrated in State 22. The interfacial amorphous layer 18 is a layer containing at least one of silicon carbide (SiC) and carbon-containing silicon oxide (SiOC). In State 22, when a concentration of carbon in the natural oxide film 17 increases to a predetermined value and saturates, the reaction between the active species of carbon and the natural oxide film 17 does not proceed, and the formation of the interfacial amorphous layer 18 is completed.

After the formation of the interfacial amorphous layer 18 is completed, the graphene film forming process is performed on the substrate W in State 22. When the formation of the graphene film progresses, the substrate W transitions to State 23. In State 23, a graphene film 19 is formed on the interfacial amorphous layer 18. That is, it is possible to implement a state in which the interfacial amorphous layer 18 having no crystal grain boundary is positioned between the base film 15 and the graphene film 19.

Since the interfacial amorphous layer 18 is positioned between the base film 15 and the graphene film 19, it is possible to improve the barrier property at the interface between the substrate W and the graphene film 19 compared to the case in which the graphene film is directly formed on the silicon substrate or the insulating film. That is, when the graphene film is directly formed on the silicon substrate or the insulating film, the crystal grain boundaries of the graphene film serve as diffusion paths, so that elements diffuse from the silicon substrate, or elements diffuse from a metal-containing film or the like formed on the graphene film toward the silicon substrate. In contrast, in the film forming method according to the embodiment, by forming the interfacial amorphous layer 18 between the base film 15 and the graphene film 19, the crystal grain boundaries serving as the diffusion paths of the graphene film 19 are blocked with an interfacial amorphous layer that does not have grain boundaries. Therefore, the diffusion of elements through the diffusion paths of the graphene film 19 is suppressed, and thus it is possible to improve the barrier property at the interface between the substrate W and the graphene film 19.

In the above description, the case in which the interfacial amorphous layer forming process and the graphene film forming process are performed on the substrate W on which the base film 15 is formed has been described, but the wafer W on which a film is to be formed may be a silicon substrate 16 that does not include the base film 15. In this case as well, in State 21, a natural oxide film 17 is formed on the surface of the silicon substrate 16. When the interfacial amorphous layer forming process is performed on the substrate W in State 21, the substrate W transitions to State 22. In the interfacial amorphous layer forming process, since the active species of carbon contained in the plasma of the first mixed gas react with the natural oxide film 17 on the silicon substrate 16, the interfacial amorphous layer 18 is formed on the silicon substrate 16, as illustrated in State 22. After the formation of the interfacial amorphous layer 18 is completed, the graphene film forming process is performed on the substrate W in State 22, and when the formation of the graphene film progresses, the substrate W transitions to State 23.

[Mechanism of State Transition up to Formation of Graphene Film]

Figure 3:
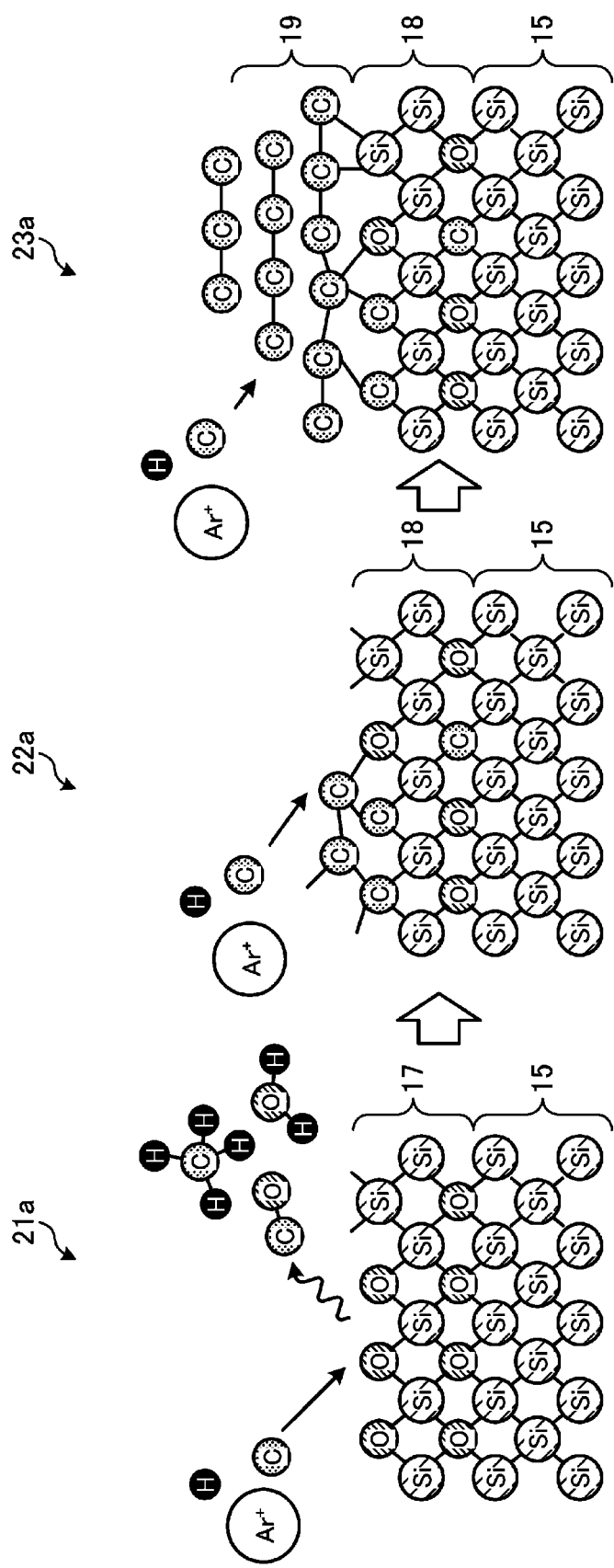
FIG. 3 is a view illustrating an example of a mechanism of the state transition of the substrate from the formation of the interface layer having the amorphous structure or the microcrystalline structure to the formation of the graphene film.

Next, a mechanism of the state transition of the substrate from the formation of the interfacial amorphous layer 18 to the formation of the graphene film 19 will be described with reference to FIG. 3. FIG. 3 is a view illustrating an example of the mechanism of the state transition of the substrate from the formation of the interfacial amorphous layer 18 to the formation of the graphene film 19. State 21a illustrated in FIG. 3 corresponds to State 21 of FIG. 2, State 22a corresponds to State 22 of FIG. 2, and State 23a corresponds to State 23 of FIG. 2. As illustrated in State 21a, active species of carbon (C), hydrogen (H), and argon (Ar) are supplied to the surface of the natural oxide film 17 so that reactions of the following Formulas (1) to (4) occur inside the natural oxide film 17 and on the surface of the base film 15.

$$2H + O \rightarrow H_2O \uparrow \quad (1)$$

$$C + O \rightarrow CO \uparrow \quad (2)$$

$$C + 4H \rightarrow CH_4 \uparrow \quad (3)$$

$$SiO + 2C \rightarrow SiC + CO \uparrow \quad (4)$$

That is, oxygen is removed from the surface of the natural oxide film 17 by the reactions of Formulas (1) and (2). Thereafter, when the oxygen on the surface of the natural oxide film 17 is reduced, as illustrated in State 22a, the reaction of Formula (4) occurs inside the natural oxide film 17 and on the surface of the base film 15, thereby forming Si—C bonds. Then, when the reaction of Formula (4) is saturated, the formation of the interfacial amorphous layer 18 is completed.

After the formation of the interfacial amorphous layer 18 is completed, carbon atoms on the surface of the interfacial amorphous layer 18 are bonded to each other to form a graphene film 19, as illustrated in State 23a.

[Composition Change of Interfacial Amorphous Layer according to Flow Rate Control of $H_2$ Gas]

Figure 4:
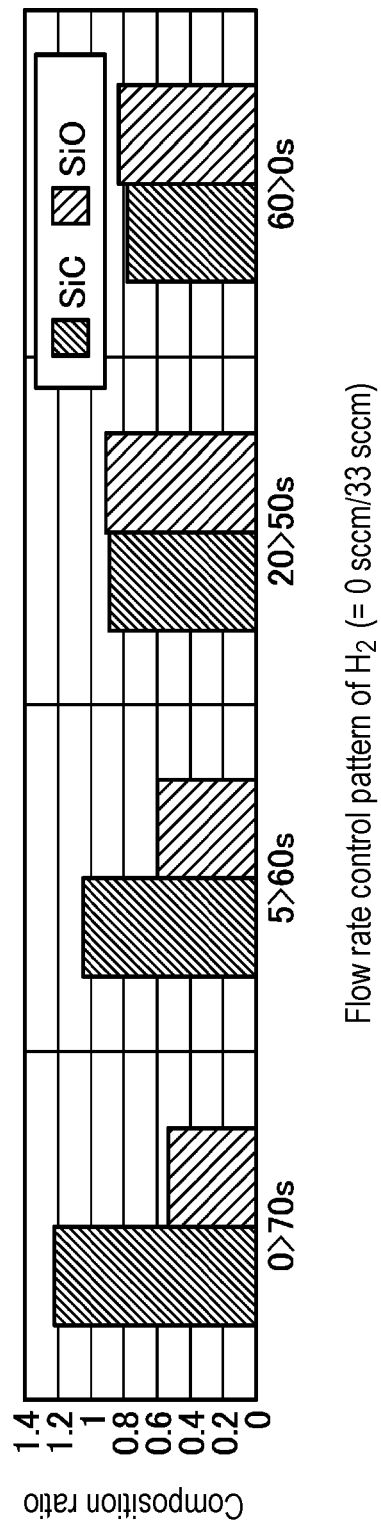
FIG. 4 is a view illustrating an example of relationships between flow rate control patterns of a $H_2$ gas and each composition ratio of SiC and SiO in the interface layer having the amorphous structure or the microcrystalline structure.

Next, a composition change of the interfacial amorphous layer 18 according to a flow rate control of the hydrogen-containing gas ($H_2$ gas) will be described with reference to FIG. 4. FIG. 4 is a diagram showing an example of relationships between flow rate control patterns of the $H_2$ gas and each composition ratio of SiC and SiO in the interfacial amorphous layer 18. In FIG. 4, the horizontal axis represents four flow rate control patterns for controlling the flow rate of the $H_2$ gas in the first mixed gas from 0 sccm to 33 sccm according to the lapse of time. The four flow rate control patterns are Patterns (1) to (4) below.

Pattern (1): a pattern in which the flow rate of the $H_2$ gas is set to 0 sccm for 0 seconds and then set to 33 sccm for 70 seconds (denoted as "0>70s")

Pattern (2): a pattern in which the flow rate of the $H_2$ gas is set to 0 sccm for 5 seconds and then set to 33 sccm for 60 seconds (denoted as "5>60s")

Pattern (3): a pattern in which the flow rate of the $H_2$ gas is set to 0 sccm for 20 seconds and then set to 33 sccm for 50 seconds (denoted as "20>50s")

Pattern (4): a pattern in which the flow rate of the $H_2$ gas is set to 0 sccm for 60 seconds and then set to 33 sccm for 0 seconds (denoted as "60>0s")

In addition, in FIG. 4, the vertical axis represents each composition ratio of SiC and SiO in the interfacial amorphous layer 18. Each composition ratio of SiC and SiO is a value calculated by using the analysis result obtained by performing transmission electron microscope (TEM)-electron energy-loss spectroscopy (EELS) analysis on the interfacial amorphous layer 18.

As shown in FIG. 4, as the time for setting the flow rate of the $H_2$ gas in the first mixed gas to 0 sccm increases, the composition ratio of SiC in the interfacial amorphous layer 18 decreases and the composition ratio of SiO increases. On the other hand, as the time for setting the flow rate of the $H_2$ gas in the first mixed gas to 0 sccm decreases, the composition ratio of SiC in the interfacial amorphous layer 18 increases and the composition ratio of SiO decreases.

From the results of FIG. 4, it can be seen that, when the flow rate of the $H_2$ gas in the first mixed gas is controlled from a first flow rate (0 sccm) to a second flow rate (33 sccm) larger than the first flow rate according to the lapse of time, each composition ratio of SiC and SiO in the interfacial amorphous layer 18 changes. In other words, in the interfacial amorphous layer forming process, by controlling the flow rate of the hydrogen-containing gas in the first mixed gas to vary according to the lapse of time, it is possible to make the composition of the interfacial amorphous layer 18 to be formed vary depending on the flow rate of the hydrogen-containing gas. For example, when controlling the flow rate of the hydrogen-containing gas in the first mixed gas from the first flow rate to the second flow rate in the interfacial amorphous layer forming process, it is possible to increase the composition ratio of SiC in the interfacial amorphous layer 18 by decreasing the setting time of the first flow rate. As a result, since a bonding force due to Si—C bonds is applied to the interfacial amorphous layer 18 positioned between the base film 15 and the graphene film 19, it is possible to improve the adhesion between the base film 15 and the graphene film 19. Meanwhile, in the interfacial amorphous layer forming process, it is possible to reduce the composition ratio of SiC in the interfacial amorphous layer 18 by reducing the setting time of the first flow rate. As a result, since an electrical resistance value of the interfacial amorphous layer 18 positioned between the base film 15 and the graphene film 19 changes, it is possible to appropriately adjust a contact resistance characteristic between the base film 15 and the graphene film 19.

[Evaluation of Barrier Property]

Figure 5:
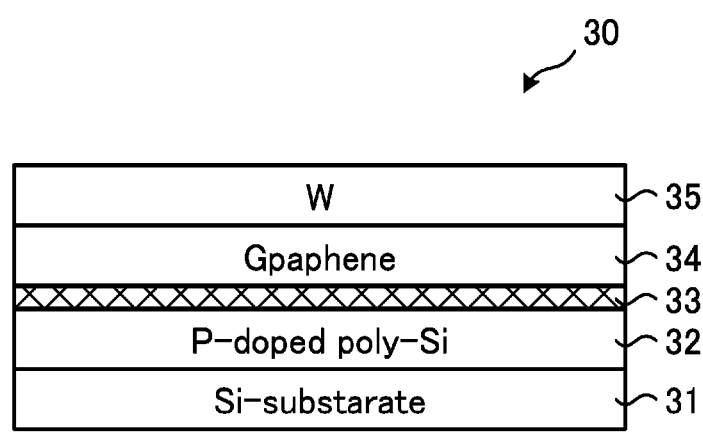
FIG. 5 is a view illustrating an example of a structure of a sample used for evaluation.

Next, evaluation of the barrier property of the graphene film formed on the substrate by the film forming method according to the embodiment will be described with reference to FIGS. 5 to 7. The present inventors conducted an investigation to evaluate a barrier property between a graphene film formed on a sample by the film forming method according to the embodiment, and the sample. FIG. 5 is a view illustrating an example of a structure of a sample 30 used for evaluation. The sample 30 has a phosphorus (P)-doped polysilicon film 32 as a base film on a silicon substrate 31. FIG. 5 illustrates a state in which an interfacial amorphous layer 33 and a graphene film 34 are formed on the phosphorus-doped polysilicon film 32 in this order from below. A tungsten (W) film 35 is further formed on the graphene film 34 as a metal-containing film. In evaluating the barrier property, after heating the sample 30 illustrated in FIG. 5 at 800 degrees C. for 2 hours in an $N_2/H_2$ gas atmosphere, secondary ion mass spectrometry (SIMS) analysis was performed on the surface of the sample 30.

Figure 6:
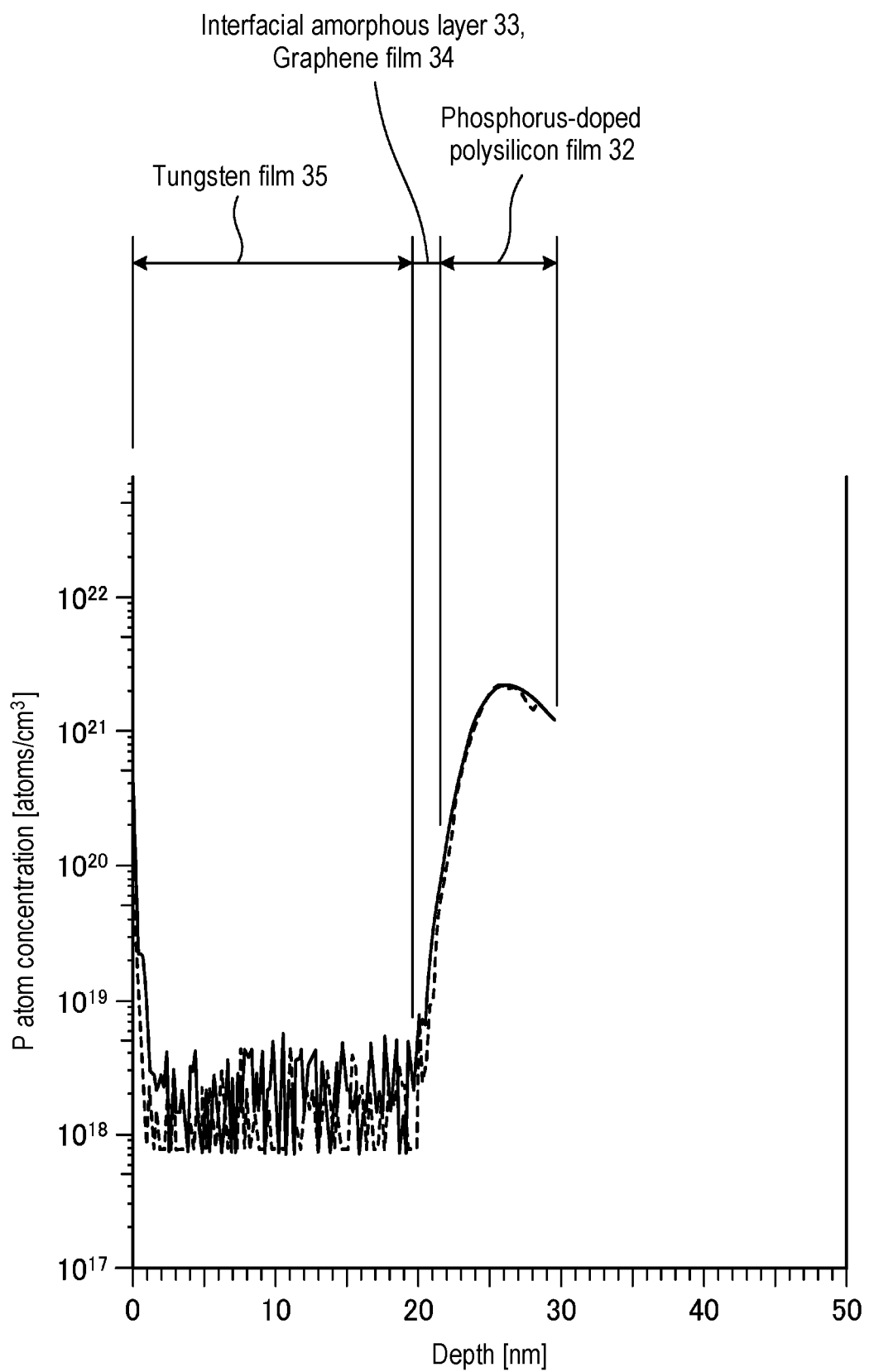
FIG. 6 is a diagram showing an example of an analysis result obtained by performing a SIMS analysis on a surface of the sample.
Figure 7:
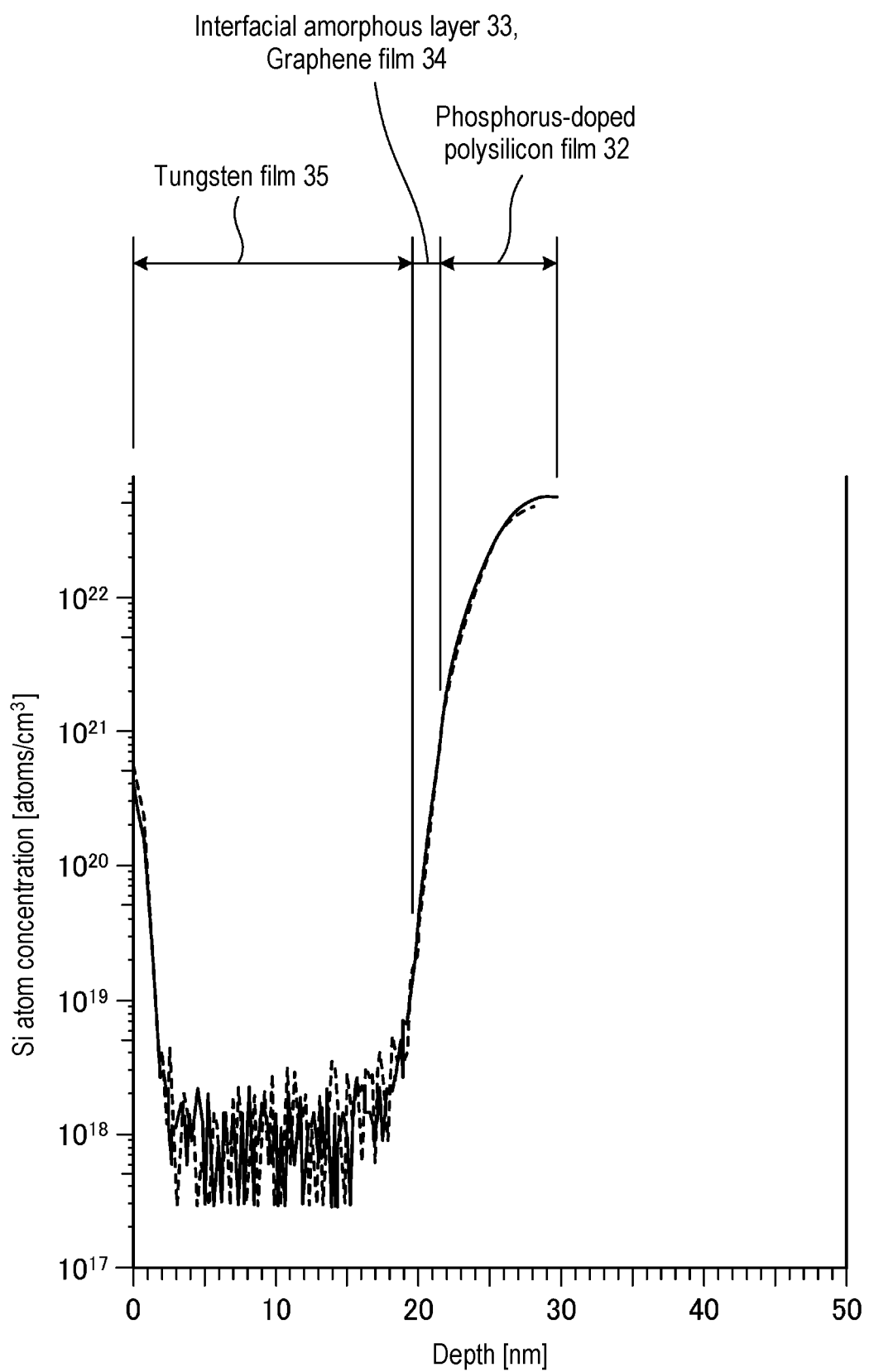
FIG. 7 is a diagram showing an example of the analysis result obtained by performing the SIMS analysis on the surface of the sample.

FIGS. 6 and 7 are diagrams showing examples of analysis results obtained by performing SIMS analysis on the surface of the sample 30. In each of FIGS. 6 and 7, the horizontal axis represents the depth [mm] from the surface of the sample 30. In FIG. 6, the vertical axis represents the atomic concentration of phosphorus (P) [atoms/cm$^3$], and in FIG. 7, the vertical axis represents the atomic concentration of silicon (Si) [atoms/cm$^3$]. In addition, FIGS. 6 and 7 show analysis results for two samples 30, respectively.

The analysis results of FIGS. 6 and 7 show that, since the interfacial amorphous layer 33 is positioned between the phosphorus-doped polysilicon film 32 and the graphene film 34, phosphorus and silicon are not diffused from the phosphorus-doped polysilicon film 32 into the tungsten film 35. That is, the analysis results of FIGS. 6 and 7 show that it is possible to improve the barrier property at the interface between the phosphorus-doped polysilicon film 32, which is a base film on the substrate, and the graphene film 34 by forming the graphene film 34 by using the film forming method according to the embodiment.

[Evaluation of Adhesion]

The present inventors evaluated adhesion between the graphene film 34 and the phosphorus-doped polysilicon film 32, which is the base film on the substrate, by using the sample 30 illustrated in FIG. 5. In the adhesion evaluation, with respect to the sample 30 shown in FIG. 5, the presence or absence of separation between the phosphorus-doped polysilicon film 32 and the graphene film 34 was investigated in accordance with JIS K5400-8.5 (JIS D0202) "Adhesion-Crosscut Test." As a result, separation between the phosphorus-doped polysilicon film 32 and the graphene film 34 did not occur. From this evaluation result, it can be seen that, by forming the graphene film 34 by using the film forming method according to the embodiment, it is possible to obtain the adhesion between the phosphorus-doped polysilicon film 32, which is the base film on the substrate, and the graphene film 34.

[Modifications]

Although one embodiment has been described so far, the embodiment may also be modified.

In the above-described embodiment, a third process of modifying a natural oxide film on a base film or a silicon substrate by the plasma of a third mixed gas including a hydrogen-containing gas may be performed between the loading process (step S101) and the interfacial amorphous layer forming process (step S102). As the hydrogen-containing gas, for example, a $H_2$ gas may be used. In addition, the third mixed gas may include an inert gas in addition to the hydrogen-containing gas. As the inert gas, for example, an Ar gas may be used. In the third process, it is possible to modify the natural oxide film on the base film or the silicon substrate into a film having more oxygen defects than the natural oxide film (hereinafter, referred to as a "modified oxide film"). This makes it possible to complement the active species of carbon to the oxygen defects in the modified oxide film in the interfacial amorphous layer forming process. As a result, it is possible to enhance a film forming rate of the interfacial amorphous layer.

In the above-described embodiment, a fourth process of modifying a surface layer of the interfacial amorphous layer by the plasma of the third mixed gas including the hydrogen-containing gas may be performed between the interfacial amorphous layer forming process (step S102) and the graphene film forming process (step S103). As the hydrogen-containing gas, for example, a $H_2$ gas may be used. In addition, the third mixed gas may include an inert gas in addition to the hydrogen-containing gas. As the inert gas, for example, an Ar gas may be used. In the fourth process, it is possible to modify the surface layer of the interfacial amorphous layer into a layer having more oxygen defects (hereinafter, referred to as a "modified layer"). This makes it possible to complement the active species of carbon to the oxygen defects in the modified layer in the graphene film forming process. As a result, it is possible to enhance a film forming rate of the graphene film.

In addition, in the above-described embodiment, a fifth process of etching a natural oxide film on a base film or a silicon film may be performed between the loading process (step S101) and the interfacial amorphous layer forming process (step S102). In the fifth process, a portion of the natural oxide film is removed by plasma of a fourth mixed gas including, for example, a carbon-containing gas, a hydrogen-containing gas, and an inert gas. This makes it possible to cause the active species of carbon to react with a thin natural oxide film in the interfacial amorphous layer forming process. As a result, it is possible to enhance a film forming rate of the interfacial amorphous layer.

In addition, a sixth process of supplying an oxygen-containing gas into the processing container may be performed between the fifth process and the interfacial amorphous layer forming process (step S102). In the sixth process, after removing the natural oxide film, a pseudo natural oxide film having more oxygen defects than the natural oxide film may be formed. This makes it possible to complement the active species of carbon to the oxygen defects in the pseudo natural oxide film in the interfacial amorphous layer forming process. As a result, it is possible to enhance a film forming rate of the interfacial amorphous layer.

In the above-described embodiment, before the loading process (step S101), a seventh process of removing oxygen from the processing container by plasma of a hydrogen-containing gas may be performed in the state in which no substrate is present in the processing container. This may make it possible to suppress oxidization of the surface of the substrate or the surface of the base film on the substrate by oxygen inside the processing container after the substrate is loaded into the processing container.

In the above-described embodiment, after the graphene film forming process (step S103), an eighth process of modifying the interfacial amorphous layer may be performed by performing heat treatment (annealing) under the atmosphere of the fourth mixed gas including at least one of the hydrogen gas and the inert gas (e.g., the argon gas, the helium gas, the nitrogen gas, and the like). In the eighth process, it is possible to modify only the interfacial amorphous layer without changing the quality of the graphene film. Modification of such an interfacial amorphous layer will be described with reference to FIGS. 8A to 8C.

Figure 8A:
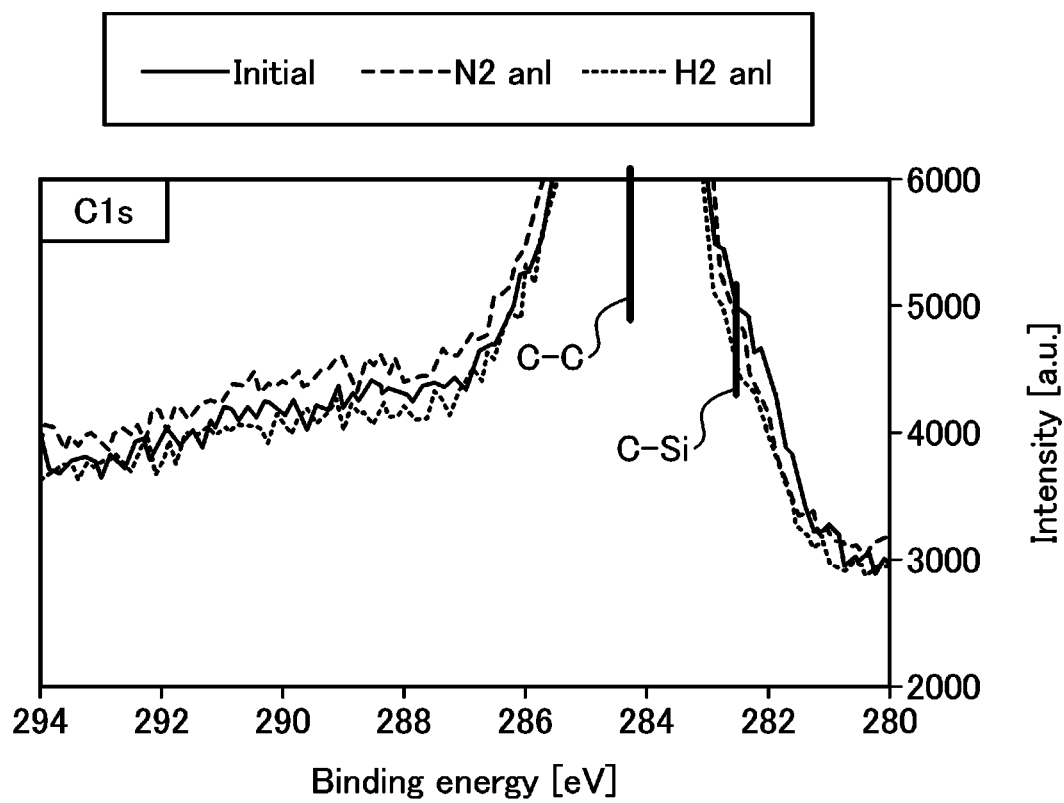
FIG. 8A is a diagram showing an example of an analysis result obtained by performing an XPS analysis on a substrate subjected to heat treatment (annealing).
Figure 8B:
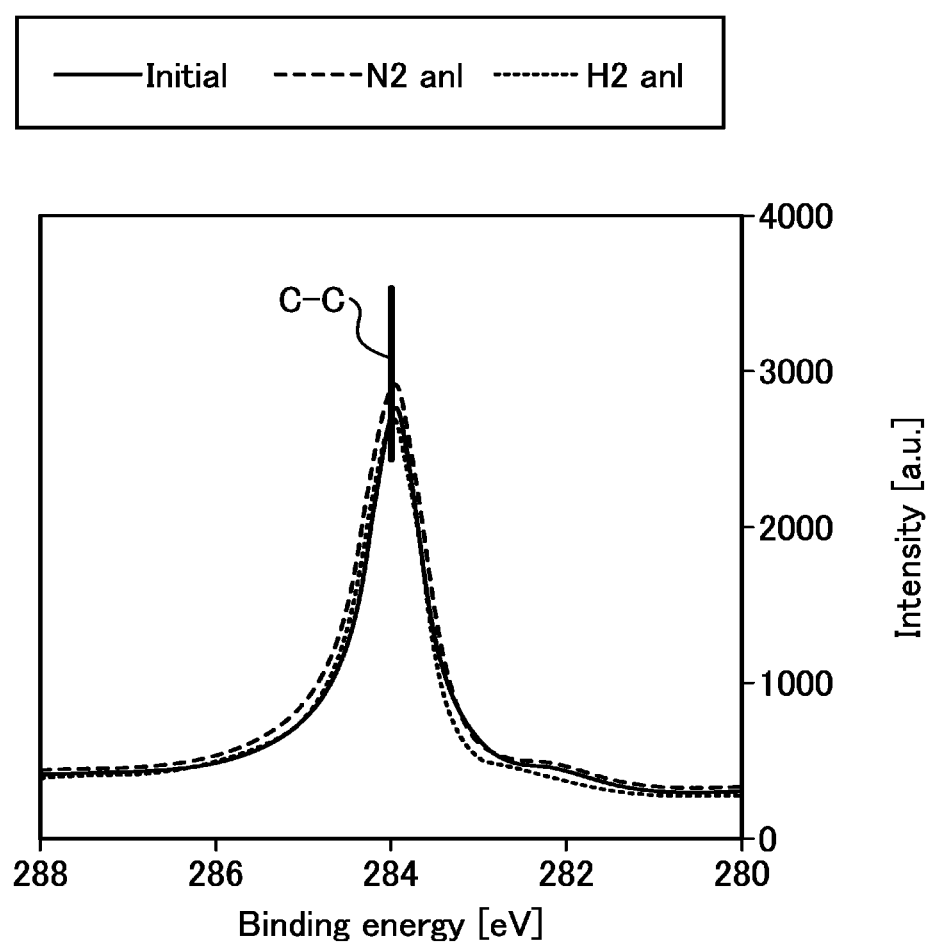
FIG. 8B is a diagram showing an example of the analysis result obtained by performing the XPS analysis on the substrate subjected to heat treatment (annealing).
Figure 8C:
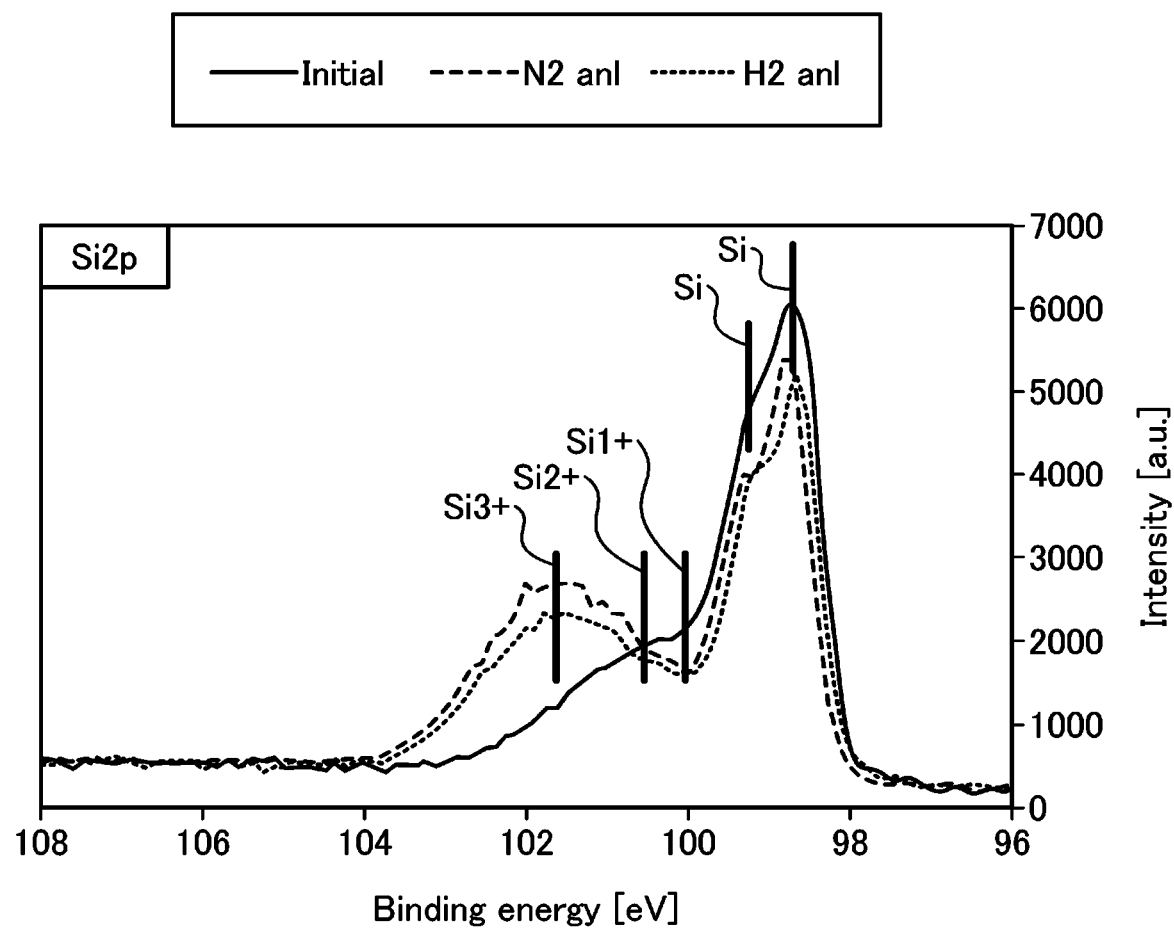
FIG. 8C is a diagram showing an example of the analysis result obtained by performing the XPS analysis on the substrate subjected to heat treatment (annealing).

The present inventors investigated bond intensity of the interfacial amorphous layer in the case in which an interfacial amorphous layer and a graphene film are sequentially formed on the substrate W, and heat treatment (annealing) was performed with the hydrogen ($H_2$) gas and the nitrogen ($N_2$) gas as an inert gas under each atmosphere. FIGS. 8A to 8C are diagrams showing examples of analysis results obtained by performing XPS analysis on the substrate subjected to the heat treatment (annealing). FIGS. 8A to 8C illustrate bonding intensities of the interface amorphous layers, respectively, when substrates W, on each of which a silicon film as a base film is formed, were subjected to the heat treatment (annealing) in atmospheres of the hydrogen ($H_2$) gas and the nitrogen ($N_2$) gas, respectively. The heat treatment (annealing) was performed under the following conditions: the heat treatment temperature is 500 degrees C. or higher (e.g., 800 degrees C.), the flow rate of each of the hydrogen gas and the nitrogen gas is 100 to 10,000 sccm, and the treatment time is 30 minutes or longer.

In FIGS. 8A to 8C, "Initial" indicates the bond intensity of each bond in the interfacial amorphous layer before the heat treatment (annealing). In addition, in FIGS. 8A to 8C, "$N_2$ anl" indicates the bond intensity of each bond in the interfacial amorphous layer after the heat treatment (annealing) was performed under the nitrogen gas atmosphere. Further, in FIGS. 8A to 8C, "$H_2$ anl" indicates the bond intensity of each bond in the interfacial amorphous layer after the heat treatment (annealing) was performed under the hydrogen gas atmosphere.

In FIG. 8A, it can be seen that the bond intensity of the C—Si bond is slightly reduced by the heat treatment (annealing) under the atmosphere of each of the hydrogen ($H_2$) gas and the nitrogen ($N_2$) gas. In addition, in FIG. 8B, since it is possible to maintain the bond intensity of the C—C bond, it may be presumed that the thickness and quality of the graphene film have not changed. In FIG. 8C, it can be seen that the valence of Si oxide increases from monovalence to trivalence. From these results, it can be seen that the heat treatment (annealing) is able to modify only the interfacial amorphous layer without changing the quality of the graphene film. Moreover, it can be seen that it is possible to control each composition ratio of SiC and SiO by performing the heat treatment (annealing).

In the above-described embodiments, the case in which the base film of the substrate is a polysilicon (polycrystalline silicon) film or a silicon film has been described as an example. Without being limited thereto, for example, a metal film such as a titanium (Ti) film may be used as the base film of the substrate.

[Film Forming Apparatus According to Embodiment]

Figure 9:
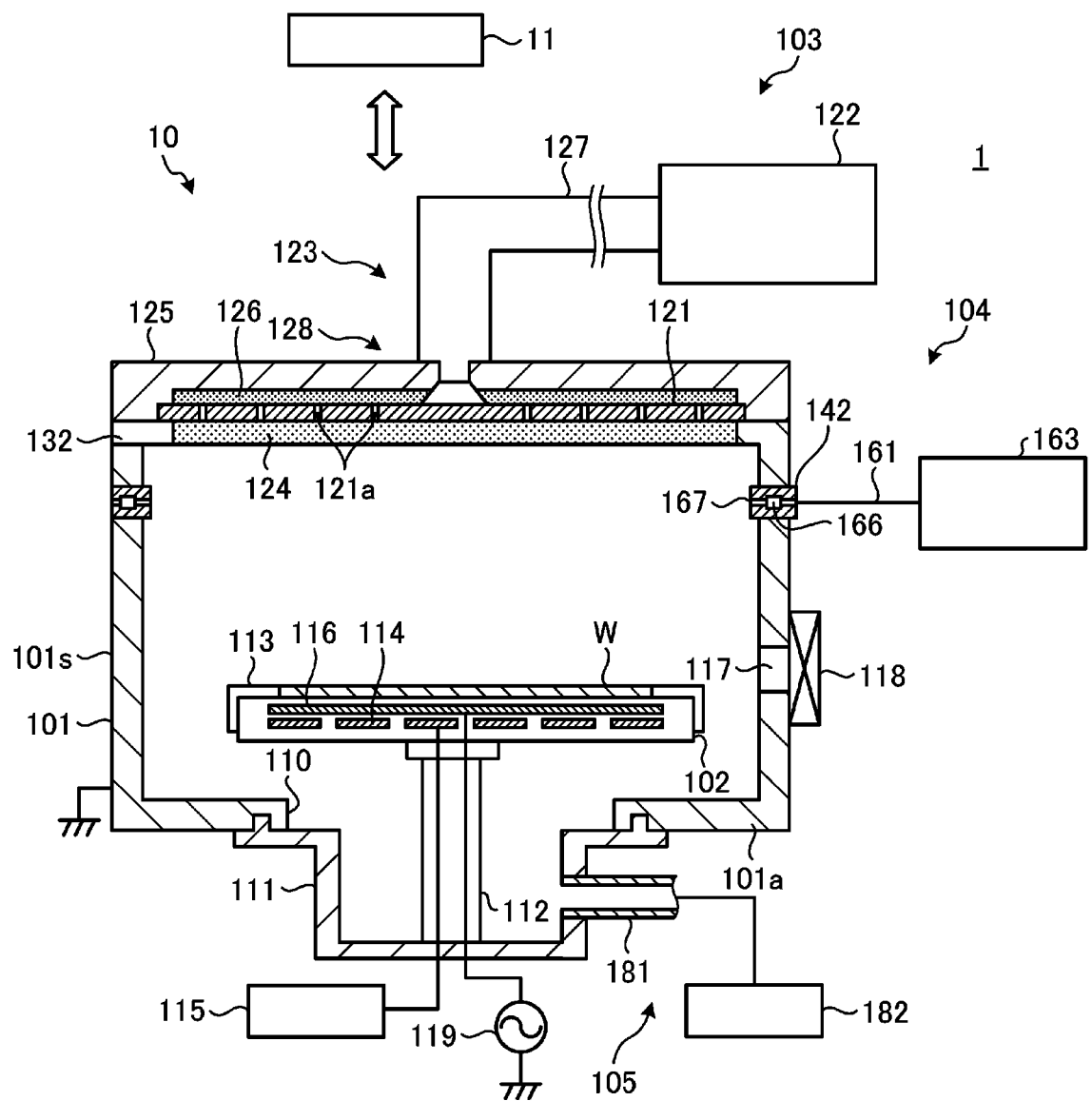
FIG. 9 is a schematic cross-sectional view illustrating an example of a film forming apparatus according to an embodiment.

FIG. 9 is a schematic cross-sectional view illustrating an example of a film forming apparatus according to an embodiment. A film forming apparatus 1 illustrated in FIG. 9 is configured as, for example, an RLSA (registered trademark) microwave plasma-type plasma processing apparatus.

The film forming apparatus 1 includes an apparatus main body 10 and a controller 11 that controls the apparatus main body 10. The apparatus main body 10 includes a chamber 101, a stage 102, a microwave introduction mechanism 103, a gas supply mechanism 104, and an exhaust mechanism 105.

The chamber 101 is formed in a substantially cylindrical shape, and an opening 110 is formed in a substantially central portion of a bottom wall 101a of the chamber 101. The bottom wall 101a is provided with an exhaust chamber 111 that communicates with the opening 110 and protrudes downward. An opening 117 through which a substrate (hereinafter, also referred to as a "wafer") W passes is formed in a sidewall 101s of the chamber 101, and the opening 117 is opened/closed by a gate valve 118. The chamber 101 is an example of the processing container.

The substrate W to be processed is placed on the stage 102. The stage 102 has a substantially disk-like shape and is made of ceramic such as AlN. The stage 102 is supported by a cylindrical support member 112 made of ceramic such as AlN and extending upward from the center of the bottom portion of the exhaust chamber 111. An edge ring 113 is provided on an outer edge of the stage 102 to surround the substrate W placed on the stage 102. Inside the stage 102, lifting pins (not illustrated) for raising and lowering the substrate W are provided to be capable of moving upward and downward with respect to the upper surface of the stage 102.

A resistance heating-type heater 114 is embedded in the stage 102. The heater 114 heats the substrate W placed on the stage 102 according to power supplied from a heater power supply 115. A thermocouple (not illustrated) is inserted into the stage 102 so that the temperature of the substrate W can be controlled to, for example, 350 to 850 degrees C., based on a signal from the thermocouple. In the stage 102, an electrode 116 having substantially the same size as the substrate W is embedded above the heater 114. A bias power supply 119 is electrically connected to the electrode 116. The bias power supply 119 supplies bias power of a predetermined frequency and magnitude to the electrode 116. The bias power supplied to the electrode 116 draws ions into the substrate W placed on the stage 102. The bias power supply 119 may not be provided depending on the characteristics of plasma processing.

The microwave introduction mechanism 103 is provided above the chamber 101 and includes an antenna 121, a microwave output part 122, and a microwave transmission mechanism 123. In the antenna 121, a large number of slots 121a, which are through-holes, are formed. The microwave output part 122 outputs microwaves. The microwave transmission mechanism 123 guides the microwaves output from the microwave output part 122 to the antenna 121.

A dielectric window 124 made of a dielectric material is provided under the antenna 121. The dielectric window 124 is supported by a support member 132 provided in a ring shape above the chamber 101. A slow-wave plate 126 is provided on the antenna 121. A shield member 125 is provided on the antenna 121. A flow path (not illustrated) is provided inside the shield member 125, and the shield member 125 cools the antenna 121, the dielectric window 124, and the slow-wave plate 126 by a fluid such as water flowing in the flow path.

The antenna 121 is formed of, for example, a copper plate or an aluminum plate, the surface of which is silver or gold-plated. A plurality of slots 121a for radiating microwaves are arranged in a predetermined pattern. The arrangement pattern of the slots 121a is appropriately set such that microwaves are evenly radiated. An example of a suitable pattern includes a radial line slot in which a plurality of pairs of slots 121a are concentrically arranged. The two slots 121a in each pair are arranged in a T shape. The lengths and the arrangement intervals of the slots 121a are appropriately determined according to the effective wavelength λg of microwaves. The slots 121a may have other shapes such as a circular shape and an arc shape. The arrangement form of the slots 121a is not particularly limited, and the slots 121a may be arranged, for example, in a spiral shape or a radial shape, in addition to the concentric circle shape. The pattern of the slots 121a is appropriately set to have a microwave radiation characteristic that is capable of obtaining a desired plasma density distribution.

The slow-wave plate 126 is made of a dielectric material having a dielectric constant larger than that of vacuum, such as quartz, ceramic ($Al_2O_3$), polytetrafluoroethylene, or polyimide. The slow-wave plate 126 has a function of making the wavelength of microwaves shorter than that in vacuum to make the antenna 121 smaller. The dielectric window 124 is also made of a similar dielectric material.

Thicknesses of the dielectric window 124 and the slow-wave plate 126 are adjusted such that an equivalent circuit formed by the slow-wave plate 126, the antenna 121, the dielectric window 124, and plasma satisfies a resonance condition. By adjusting the thickness of the slow-wave plate 126, it is possible to adjust the phase of microwaves. By adjusting the thickness of the slow-wave plate 126 such that a bonded portion of the antenna 121 becomes an "antinode" of a standing wave, the reflection of microwaves is minimized, so that it is possible to maximize the radiation energy of the microwaves. By using the same material for the slow-wave plate 126 and the dielectric window 124, it is possible to prevent interfacial reflection of microwaves.

The microwave output part 122 includes a microwave oscillator. The microwave oscillator may be of a magnetron type or a solid state type. The frequency of microwaves generated by the microwave oscillator is, for example, a frequency of 300 MHz to 10 GHz. As an example, the microwave output part 122 outputs microwaves of 2.45 GHz by a magnetron-type microwave oscillator. Microwaves are an example of electromagnetic waves.

The microwave transmission mechanism 123 includes a waveguide 127 and a coaxial waveguide 128. The microwave transmission mechanism 123 may include a mode conversion mechanism. The waveguide 127 guides microwaves output from the microwave output part 122. The coaxial waveguide 128 includes an inner conductor connected to the center of the antenna 121 and an outer conductor outside the inner conductor. The mode conversion mechanism is provided between the waveguide 127 and the coaxial waveguide 128. The microwaves output from the microwave output part 122 propagate in the waveguide 127 in a TE mode, and are converted from the TE mode to a TEM mode by the mode conversion mechanism. The microwaves converted into the TEM mode propagate to the slow-wave plate 126 via the coaxial waveguide 128, and are radiated within the chamber 101 by passing through the slots 121a in the antenna 121 and the dielectric window 124 from the slow-wave plate 126. A tuner (not illustrated) for matching the impedance of a load (plasma) in the chamber 101 with the output impedance of the microwave output part 122 is provided in the waveguide 127.

The gas supply mechanism 104 includes a shower ring 142 provided in a ring shape along the inner wall of the chamber 101. The shower ring 142 includes a ring-shaped flow path 166 provided therein, and a large number of ejection ports 167 connected to the flow path 166 and opened inward of the flow path 166. A gas supply part 163 is connected to the flow path 166 via a pipe 161. The gas supply part 163 is provided with a plurality of gas sources and a plurality of flow rate controllers. In an embodiment, the gas supply part 163 is configured to supply at least one processing gas from the corresponding gas source to the shower ring 142 via the corresponding flow rate controller. The gas supplied to the shower ring 142 is supplied into the chamber 101 from the plurality of ejection ports 167.

When a graphene film is formed on the substrate W, the gas supply part 163 supplies a carbon-containing gas, a hydrogen-containing gas, and a noble gas, which are controlled at a predetermined flow rate, into the chamber 101 through the shower ring 142. In the present embodiment, the carbon-containing gas is, for example, a $C_2H_2$ gas. Instead of the $C_2H_2$ gas or in addition to the $C_2H_2$ gas, a $C_2H_4$ gas, a $CH_4$ gas, a $C_2H_6$ gas, a $C_3H_8$ gas, a $C_3H_6$ gas, and the like may be used. In the present embodiment, the hydrogen-containing gas is, for example, a hydrogen gas. Instead of the hydrogen gas or in addition to the hydrogen gas, a halogen-based gas, such as a $F_2$ (fluorine) gas, a $Cl_2$ (chlorine) gas, or a $Br_2$ (bromine) gas, may be used. In the present embodiment, the noble gas is, for example, an Ar gas. Instead of the Ar gas, another noble gas such as a He gas may be used.

The exhaust mechanism 105 may include an exhaust chamber 111, an exhaust pipe 181 provided in the sidewall of the exhaust chamber 111, and an exhaust device 182 connected to the exhaust pipe 181. The exhaust device 182 includes a vacuum pump, a pressure control valve, and the like.

The controller 11 has a memory, a processor, and an input/output interface. The memory stores a program executed by the processor and a recipe including conditions for respective processes. In each process of the film forming method according to an embodiment, the processor executes a program read from the memory, and controls each part of the apparatus main body 10 via the input/output interface based on the recipe stored in the memory.

(Effect of Embodiment)

The film forming method according to the above-described embodiment includes the loading process (e.g., step S101), the first process (e.g., step S102, the interface amorphous layer forming process), and the second process (e.g., step S103, the graphene film forming process). In the loading process, the substrate (e.g., the substrate W) is loaded into the processing container (e.g., the chamber 101). In the first process, the interface layer (e.g., the interfacial amorphous layer 18) having the amorphous structure or the microcrystalline structure is formed on the substrate by the plasma of the first mixed gas containing the carbon-containing gas. In the second process, the graphene film (e.g., the graphene film 19) is formed on the interface layer having the amorphous structure or the microcrystalline structure by the plasma of the second mixed gas containing the carbon-containing gas. As a result, according to the film forming method according to the embodiment, it is possible to improve the barrier property at the interface between the substrate and the graphene film.

The first mixed gas may further include a hydrogen-containing gas. In addition, in the first process, the flow rate of the hydrogen-containing gas in the first mixed gas may be controlled to vary according to the lapse of time to change the composition of the interfacial amorphous layer to be formed depending on the flow rate of the hydrogen-containing gas. As a result, according to the film forming method of the embodiment, it is possible to increase or decrease the composition ratio of SiC in the interfacial amorphous layer to be formed.

The second mixed gas may further include a hydrogen-containing gas. The flow rate of the hydrogen-containing gas in the second mixed gas may be equal to or higher than the flow rate of the hydrogen-containing gas in the first mixed gas. As a result, according to the film forming method of the embodiment, it is possible to make the hydrogen-containing gas contribute to unstable carbon bonds as an etching component, and thus to stabilize the structure of the formed graphene film.

The substrate may also include a base film (e.g., the base film 15) which is formed of polycrystalline silicon or silicon. Then, in the first process, an interfacial amorphous layer may be formed by causing the active species of carbon contained in the plasma of the first mixed gas to react with the oxygen-containing layer (e.g., the natural oxide film 17) on the base film. As a result, according to the film forming method of the embodiment, it is possible to implement a state in which the interfacial amorphous layer having no crystal grain boundary is positioned between the base film of the substrate and the graphene film, so that it is possible to improve the barrier property at the interface between the substrate and the graphene film.

The substrate may also be a silicon substrate (e.g., the silicon substrate 16) which does not have a base film. Then, in the first process, an interfacial amorphous layer may be formed by causing the active species of carbon contained in the plasma of the first mixed gas to react with the oxygen-containing layer on the silicon substrate. As a result, according to the film forming method of the embodiment, it is possible to implement a state in which the interfacial amorphous layer having no crystal grain boundary is positioned between the silicon substrate and the graphene film, so that it is possible to improve the barrier property at the interface between the silicon substrate and the graphene film.

The interfacial amorphous layer may be a layer containing at least one of SiC and SiOC. As a result, according to the film forming method of the embodiment, it is possible to block the crystal grain boundaries of the graphene film with the interfacial amorphous layer having no crystal grain boundaries.

The film forming method according to the above embodiment may further include the third process of modifying the oxygen-containing layer with the plasma of the third mixed gas containing the hydrogen-containing gas between the loading process and the first process. As a result, according to the film forming method of the embodiment, it is possible to enhance the film forming rate of the interfacial amorphous layer.

The film forming method according to the above embodiment may further include the fourth process of modifying the interfacial amorphous layer with the plasma of the third mixed gas containing the hydrogen-containing gas between the first process and the second process. As a result, according to the film forming method of the embodiment, it is possible to enhance the film forming rate of the graphene film.

The film forming method according to the above-described embodiment may further include the fifth process of etching the oxygen-containing layer between the loading process and the first process. As a result, according to the film forming method of the embodiment, it is possible to enhance the film forming rate of the interfacial amorphous layer.

The film forming method according to the above-described embodiment may further include the sixth process of supplying the oxygen-containing gas into the processing container between the fifth process and the first process. As a result, according to the film forming method of the embodiment, it is possible to enhance the film forming rate of the interfacial amorphous layer.

The film forming method according to the above-described embodiment may further include the seventh process of removing oxygen in the processing container by the plasma of the hydrogen-containing gas in the state in which the substrate is not present in the processing container before the loading process. As a result, according to the film forming method of the embodiment, it is possible to suppress the oxidization of the surface of the substrate or the surface of the base film on the substrate by oxygen inside the processing container after the substrate is loaded into the processing container.

[Others]

In the above-described embodiments, the film forming apparatus 1 that performs processes such as etching and film formation on the wafer W by using microwave plasma as a plasma source has been described as an example, but the disclosed technique is not limited thereto. The plasma source is not limited to the microwave plasma as long as an apparatus uses plasma to process the wafer W, and may use any plasma source such as capacitively-coupled plasma, inductively-coupled plasma, or magnetron plasma.

According to the present disclosure, it is possible to improve a barrier property at an interface between a substrate and a graphene film.

It should be understood that the embodiments disclosed herein are examples in all respects and are not restrictive. Indeed, the above-described embodiments can be implemented in various forms. The above-described embodiments may be omitted, replaced, or modified in various forms without departing from the scope and spirit of the appended claims.

What is claimed is:

1. A film forming method comprising:
   a loading process of loading a substrate into a processing container;
   a first process of forming an interface layer having an amorphous structure on the substrate by plasma of a first mixed gas including a carbon-containing gas; and
   a second process of forming a graphene film on the interface layer by plasma of a second mixed gas including the carbon-containing gas.

2. The film forming method of claim 1, wherein the first mixed gas further includes a hydrogen-containing gas, and
   wherein, in the first process, a flow rate of the hydrogen-containing gas in the first mixed gas is controlled to vary according to a lapse of time, and a composition of the interface layer to be formed is changed according to the flow rate of the hydrogen-containing gas.

3. The film forming method of claim 2, wherein the second mixed gas further includes the hydrogen-containing gas, and
   wherein a flow rate of the hydrogen-containing gas in the second mixed gas is equal to or higher than the flow rate of the hydrogen-containing gas in the first mixed gas.

4. The film forming method of claim 3, wherein the substrate includes a base film made of polycrystalline silicon or silicon, and
   wherein, in the first process, the interface layer is formed by causing active species of carbon contained in the plasma of the first mixed gas to react with an oxygen-containing layer on the base film.

5. The film forming method of claim 3, wherein the substrate is a silicon substrate that does not include a base film, and
   wherein, in the first process, the interface layer is formed by causing active species of carbon contained in the plasma of the first mixed gas to react with an oxygen-containing layer on the silicon substrate.

6. The film forming method of claim 4, wherein the interface layer is a layer containing at least one of SiC and SiOC.

7. The film forming method of claim 6, further comprising:
a third process of modifying the oxygen-containing layer by plasma of a third mixed gas including a hydrogen-containing gas, between the loading process and the first process.

8. The film forming method of claim 6, further comprising:
a fourth process of modifying a surface layer of the interface layer by plasma of a third mixed gas including a hydrogen-containing gas, between the first process and the second process.

9. The film forming method of claim 8, further comprising:
a fifth process of etching the oxygen-containing layer between the loading process and the first process.

10. The film forming method of claim 9, further comprising:
a sixth process of supplying an oxygen-containing gas into the processing container between the fifth process and the first process.

11. The film forming method of claim 10, further comprising:
a seventh process of removing oxygen inside the processing container by plasma of a hydrogen-containing gas while the substrate is not present in the processing container, before the loading process.

12. The film forming method of claim 6, further comprising:
an eighth process of performing a heat treatment in an atmosphere of a fourth mixed gas including at least one of a hydrogen gas and an inert gas to modify the interface layer, after the second process.

13. The film forming method of claim 12, wherein the inert gas includes at least one gas selected from a group consisting of an argon gas, a helium gas, and a nitrogen gas.

14. The film forming method of claim 1, wherein the substrate includes a base film made of polycrystalline silicon or silicon, and
wherein, in the first process, the interface layer is formed by causing active species of carbon contained in the plasma of the first mixed gas to react with an oxygen-containing layer on the base film.

15. The film forming method of claim 1, wherein the substrate is a silicon substrate that does not include a base film, and
wherein, in the first process, the interface layer is formed by causing active species of carbon contained in the plasma of the first mixed gas to react with an oxygen-containing layer on the silicon substrate.

16. The film forming method of claim 4, further comprising:
a fourth process of modifying a surface layer of the interface layer by plasma of a third mixed gas including a hydrogen-containing gas, between the first process and the second process.

17. The film forming method of claim 4, further comprising:
a fifth process of etching the oxygen-containing layer between the loading process and the first process.

18. The film forming method of claim 4, further comprising:
a seventh process of removing oxygen inside the processing container by plasma of a hydrogen-containing gas while the substrate is not present in the processing container, before the loading process.

19. The film forming method of claim 4, further comprising:
an eighth process of performing a heat treatment in an atmosphere of a fourth mixed gas including at least one of a hydrogen gas and an inert gas to modify the interface layer, after the second process.

* * * * *